(12) United States Patent
von Ammon et al.

(10) Patent No.: US 8,834,627 B2
(45) Date of Patent: Sep. 16, 2014

(54) METHOD FOR PRODUCING A SINGLE CRYSTAL COMPOSED OF SILICON BY REMELTING GRANULES

(75) Inventors: Wilfried von Ammon, Hochburg (AT); Ludwig Altmannshofer, Massing (DE); Martin Wasner, Hochburg (AT)

(73) Assignee: Siltronic AG, Munich (DE)

( * ) Notice: Subject to any disclaimer, the term of this patent is extended or adjusted under 35 U.S.C. 154(b) by 993 days.

(21) Appl. No.: 12/913,970

(22) Filed: Oct. 28, 2010

(65) Prior Publication Data
US 2011/0107960 A1    May 12, 2011

(30) Foreign Application Priority Data
Nov. 11, 2009   (DE) .......................... 10 2009 052 745

(51) Int. Cl.
*C30B 9/04*   (2006.01)
*C30B 29/06*   (2006.01)
*C30B 13/20*   (2006.01)

(52) U.S. Cl.
CPC ................. *C30B 13/20* (2013.01); *C30B 29/06* (2013.01)
USPC ................... 117/16; 117/18; 117/19; 117/20; 117/930

(58) Field of Classification Search
USPC .......................... 117/16, 18, 19, 20, 932, 910
See application file for complete search history.

(56) References Cited

U.S. PATENT DOCUMENTS

| 7,325,297 B2 * | 2/2008 | Xia ................................. 29/724 |
| 2003/0145781 A1 * | 8/2003 | Von Ammon .................... 117/49 |
| 2009/0223949 A1 * | 9/2009 | Altmannshofer et al. .... 219/672 |
| 2013/0199440 A1 * | 8/2013 | Kerat et al. ..................... 117/83 |

FOREIGN PATENT DOCUMENTS

| DE | 102 04 178 B4 | 1/2008 |
| DE | 10 2008 013 326 A1 | 9/2009 |

* cited by examiner

*Primary Examiner* — Bob M Kunemund
(74) *Attorney, Agent, or Firm* — Brooks Kushman P.C.

(57) ABSTRACT

Silicon single crystals are grown by a method of remelting silicon granules, by crystallizing a conically extended section of the single crystal with the aid of an induction heating coil arranged below a rotating plate composed of silicon; feeding inductively melted silicon through a conical tube in the plate, the tube enclosing a central opening of the plate and extending below the plate, to a melt situated on the conically extended section of the single crystal in contact with a tube end of the conical tube, wherein by means of the induction heating coil below the plate, sufficient energy is provided to ensure that the external diameter of the tube end is not smaller than 15 mm as long as the conically extended section of the single crystal has a diameter of 15 to 30 mm.

2 Claims, 2 Drawing Sheets

METHOD FOR PRODUCING A SINGLE CRYSTAL COMPOSED OF SILICON BY REMELTING GRANULES

CROSS-REFERENCE TO RELATED APPLICATION

This application claims priority to German Patent Application No. DE 10 2009 052 745.1 filed Nov. 11, 2009 which is herein incorporated by reference.

BACKGROUND OF THE INVENTION

1. Field of the Invention

The invention relates to a method for producing a single crystal composed of silicon by remelting granules with the aid of a device comprising a rotating plate composed of silicon having a central opening, and a conical tube composed of silicon which encloses the opening and extends below the plate composed of silicon, a first induction heating coil, arranged above the silicon plate, for melting silicon, and a second induction heating coil arranged below the silicon plate for crystallizing molten silicon.

2. Background Art

The method is similar to the floating zone method (FZ method). The particular difference is that instead of a polycrystalline feed rod composed of silicon, polycrystalline granules composed of silicon are remelted. The granules can be obtained by precipitation in a fluidized bed. Dedicated induction heating coils ("inductor coils") are used for melting the granules and for crystallizing the molten granules, these coils being situated respectively above and below a rotating plate composed of silicon. The silicon granules are melted with the aid of the first induction heating coil and flow as a film of liquid silicon through the central opening and the conical tube of the plate and form a melt which, in a manner controlled by the second induction heating coil, is crystallized to form a growing single crystal composed of silicon. The method and devices suitable for carrying out the method are described in greater detail in DE 102 04 178 A1.

DE 10 2008 013 326 A1 includes the description of an induction heating coil for melting granules which has projecting segments in the center of the lower side, with the aid of which segments the film of liquid silicon that flows from the plate and through the conical tube to the melt can be heated and kept liquid. It has been found, however, that even when a coil of this type is used, it is not possible reliably to prevent a situation in which the tube end of the conical tube becomes narrower and narrower in the course of the growth of a conically extended section of the single crystal and, finally, freezes up as a result of silicon undergoing transition to a solid state.

SUMMARY OF THE INVENTION

It is an object of the present invention to implement measures which reliably prevent the tube end of the conical tube from freezing up. These and other objects are achieved by means of a method for producing a single crystal composed of silicon by remelting granules, comprising crystallizing a conically extended section of the single crystal with the aid of an induction heating coil arranged below a rotating plate composed of silicon; and feeding inductively melted silicon through a conical tube in the plate, the tube enclosing a central opening of the plate and extending below the plate, to a melt that is situated on the conically extended section of the single crystal and has contact with a tube end of the conical tube, wherein with the aid of the induction heating coil arranged below the plate, enough energy is provided in order that the external diameter of the tube end is not smaller than 15 mm as long as the conically extended section of the single crystal has a diameter of 15 to 30 mm, and is crystallized.

DETAILED DESCRIPTION OF THE PREFERRED EMBODIMENTS

Figure 1:
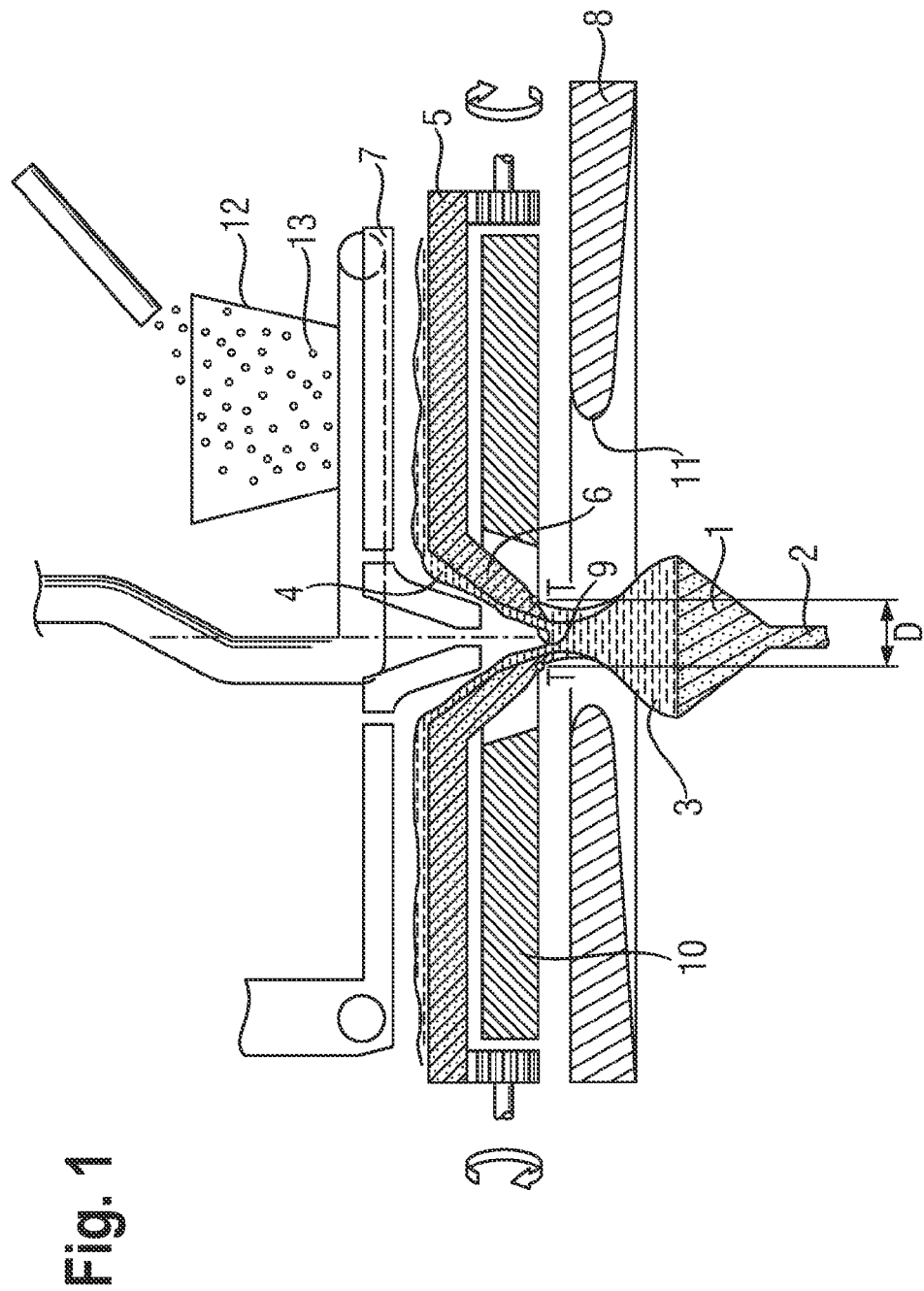
FIG. 1 illustrates a situation that leads to the tube end freezing up.

At the start of the method, the conical tube, which at this point in time is still closed off at the tube end by a layer of solid silicon, is incipiently melted at the tube end with the aid of the induction heating coil arranged below the plate, a small volume of liquid silicon arising. The tube end of the conical tube is brought to a shortest possible distance from the internal hole in the induction heating coil, in order that a high energy density can be inductively transmitted to the tube end and the forming volume of molten silicon. Afterward, a monocrystalline seed crystal is attached to the volume of molten silicon and, in accordance with the FZ method, firstly a thin neck, then a section of the single crystal that is extended conically as far as an end diameter, and finally a section having a constant desired diameter are crystallized. The requisite material of molten silicon is provided by melting of the layer closing off the tube end, by partial melting of the conical tube from the tube end, by partial melting of the plate from above and later by melting of granules composed of silicon. In the course of the crystallization of the conically extended section of the single crystal, a melt forms on the conically extended section, which melt extends through the internal hole in the induction heating coil arranged below the plate and has contact with the tube end of the conical tube by means of a solid/liquid phase boundary. When the section having the constant desired diameter is crystallized, or if appropriate already beforehand, the induction heating coil and the melt are positioned relative to one another such that the melt extends symmetrically through the internal hole in the induction heating coil.

When the conically extended section of the single crystal is crystallized, there is the risk of the conical tube narrowing to an increasing extent in the region of the tube end as a result of solidifying silicon until the tube end is completely closed off. The consequence of this is that the growth of the single crystal comes to a standstill because molten silicon can no longer be made available by the conical tube and/or because molten silicon builds up in the conical tube and finally comes into contact with the first induction heating coil, arranged above the rotating plate composed of silicon.

The reason for this is considered by the inventors to reside in the fact that the external diameter of the tube end of the conical tube during a critical phase in which the conically extended section of the single crystal has a diameter of 15 to 30 mm and is crystallized is not large enough to enable the liquid/solid phase boundary between the tube end and the melt to have a progression that avoids freezing up. The invention ensures such a progression of the phase boundary by virtue of the fact that, with the aid of the induction heating coil arranged below the plate, the tube is melted from the tube end to an extent such that the external diameter of the tube end is not less than 15 mm during the critical phase.

FIG. 1 shows the crystallizing conically extended section 1 of the single crystal and part of the previously crystallized thin neck 2. Further crystal growth is fed by the silicon melt 3 lying on the conically extended section and by the film 4 of molten silicon that flows on the inner wall of the conical tube 6 of the plate 5 composed of silicon to the melt 3. The film is produced and kept liquid by incipient melting of the plate surface by the first induction heating coil 7, arranged above the plate. At a later point in time, the induction heating coil 7 is also used to inductively melt granules 13 composed of silicon which are conveyed through a funnel 12 onto the plate 5. The film 4 is then formed principally by molten granules. The induction heating coil 7 preferably has the features of the induction heating coil described in DE 10 2008 013 326 A1. The lower side of the plate 5 is cooled, for example by a coiling device 10. The second induction heating coil 8, arranged below the plate 5 composed of silicon, is principally operated in the same way as in the FZ method, firstly in order to crystallize in controlled fashion the section 1 that is extended conically as far as an end diameter, and then in order to crystallize in controlled fashion the section of the single crystal having a constant desired diameter.

During the critical phase when the diameter of the conically extended section 1 of the single crystal has grown to 15 to 30 mm and the external diameter D of the tube end of the conical tube 6 is or becomes smaller than 15 mm, there is a high probability of the conical tube 6 freezing up at the tube end. The smaller the external diameter D, the more steeply the solid/liquid phase boundary 9 falls inward from the triple point T at the outer edge of the tube end of the conical tube 6. Owing to the gradient, the triple point T tends to be shifted inward along the phase boundary 9. Consequently, the distance between the melt 3 and the second induction heating coil 8 increases, as a result of which less energy is transmitted to the melt 3 and the melt 3 threatens to freeze solid at the tube end of the conical tube 6. Reducing the distance between induction heating coil 8 and melt 3 or increasing the heating power of the induction heating coil 8 no longer provides a remedy in this situation. Such measures even foster the increasing narrowing of the tube end because the electromagnetic pressure then presses the melt 3 and the triple point T even further inward.

Figure 2:
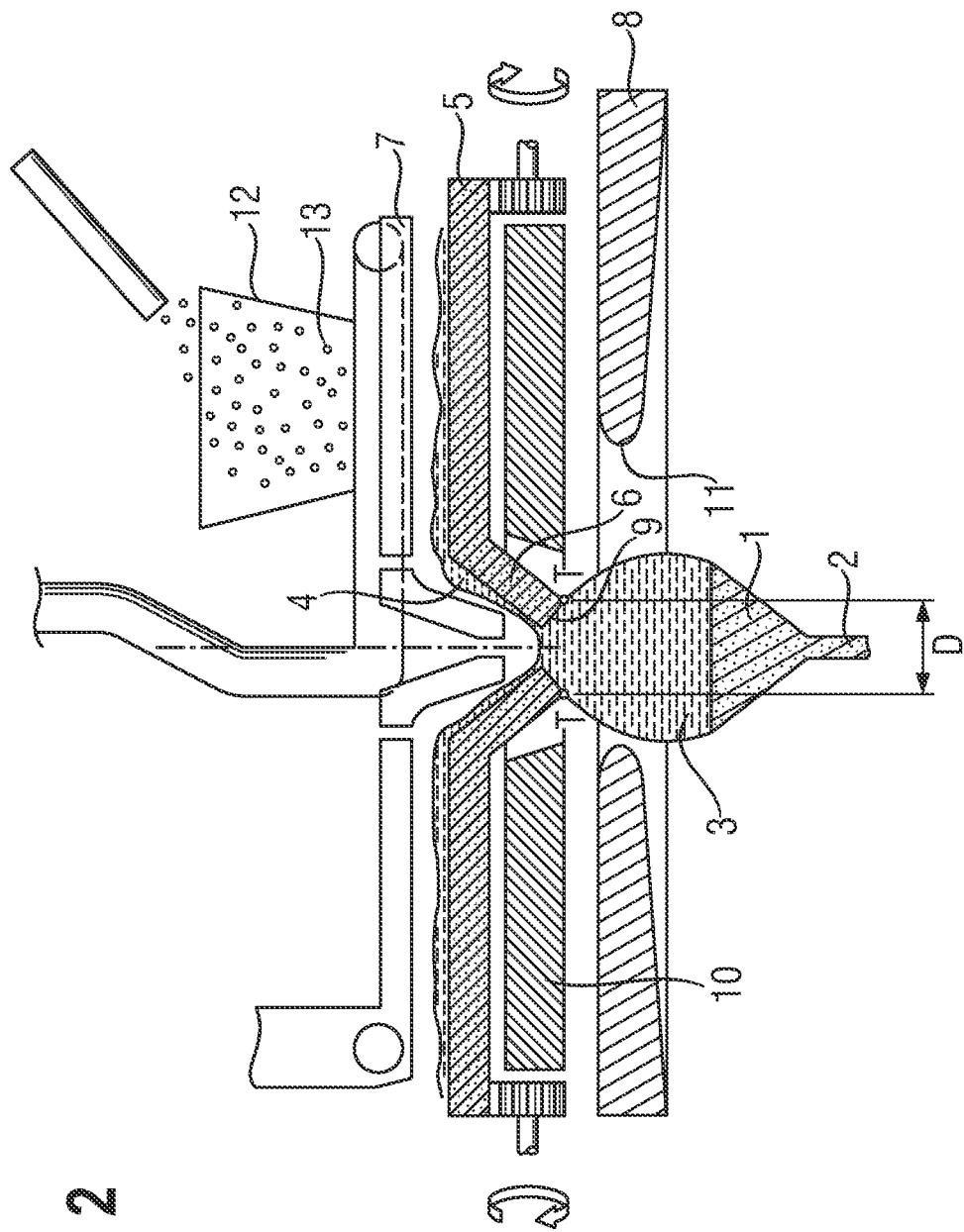
FIG. 2 illustrates how the tube end is prevented from freezing up.

In order reliably to prevent the described mechanism from proceeding, with the aid of the induction heating coil 8 arranged below the plate 5, the conical tube 6 is melted from the tube end to an extent such that the external diameter D of the tube end is not less than 15 mm during the critical phase. This results in a progression of the solid/liquid phase boundary as illustrated in FIG. 2. The solid/liquid phase boundary rises inward from the triple point T at the outer edge of the tube end of the conical tube 6. The slope suffices to ensure that the triple point T remains in stable fashion at the outer edge of the tube end of the conical tube 6, and the distance between the second induction heating coil 8 and the melt 3 does not increase.

The diameter of the internal hole 11 in the second induction heating coil 8 is greater than the diameter of the melt 3 and is preferably more than 30 mm and not more than 40 mm. The ratio of the external diameter of the tube end of the conical tube 6 and the diameter of the internal hole 11 is preferably 1:3 or greater, more preferably 1:3 to 4:5, during the critical phase.

If the conically extended section 1 has already grown to a diameter of more than 30 mm, the amount of molten silicon that continues to flow to the melt generally suffices to prevent the tube end of the conical tube 6 from freezing up, even if the external diameter D of the tube end of the conical tube falls below 15 mm.

EXAMPLE

A series of single crystals composed of silicon having a diameter of 100 mm were produced by remelting granules. The table below shows the number of attachment attempts that were necessary on average in order to successfully produce a single crystal, to be precise depending on the external diameter of the tube end of the conical tube in the period of time between reaching a diameter of the conically extended section of 15 mm and reaching a diameter of 30 mm.

| External diameter of the tube end | Attachment attempts |
|---|---|
| less than 15 mm | 4 |
| 15 mm and greater | 1 |

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing a single crystal composed of silicon by remelting silicon granules, comprising crystallizing a conically extended section of the single crystal by means of an induction heating coil below a rotating plate composed of silicon;

feeding inductively melted silicon, through a conical tube in the plate which encloses a central opening of the plate and extends below the plate, to a melt that is situated on a conically extended section of the single crystal and has contact with a tube end of the conical tube, wherein by means of the induction heating coil below the plate, sufficient energy is provided in order to melt the conical tube from the tube end to an extent such that the external diameter of the tube end is not smaller than 15 mm as long as the conically extended section of the single crystal has a diameter of 15 to 30 mm, and the silicon is crystallized.

2. The method of claim 1, wherein, by means of the induction heating coil below the plate, sufficient energy is provided in order that the ratio of the external diameter of the tube end and the diameter of an internal hole in the induction heating coil is 1:3 or greater as long as the conically extended section of the single crystal has a diameter of 15 to 30 mm.

* * * * *

UNITED STATES PATENT AND TRADEMARK OFFICE
CERTIFICATE OF CORRECTION

PATENT NO. : 8,834,627 B2  
APPLICATION NO. : 12/913970  
DATED : September 16, 2014  
INVENTOR(S) : von Ammon et al.

Page 1 of 1

It is certified that error appears in the above-identified patent and that said Letters Patent is hereby corrected as shown below:

In the Claims

Column 4, Line 57, Claim 2:

After "induction heating coil is" delete "1:3or" and
Insert -- 1:3 or --.

Signed and Sealed this
Third Day of February, 2015

Michelle K. Lee
*Deputy Director of the United States Patent and Trademark Office*